United States Patent [19]
Mescher et al.

[11] Patent Number: 6,043,106
[45] Date of Patent: Mar. 28, 2000

[54] METHOD FOR SURFACE PASSIVATION AND PROTECTION OF CADMIUM ZINC TELLURIDE CRYSTALS

[76] Inventors: Mark J. Mescher, 5640 Hobart St., Apt. #9, Pittsburg, Pa. 15217; Ralph B. James, 5420 Lenore Ave., Livermore, Calif. 94550; Tuviah E. Schlesinger, 8 Carleton Dr., Mount Lebanon, Pa. 15243; Haim Hermon, 3707 Carrigan Common, Livermore, Calif. 94550

[21] Appl. No.: 09/118,691

[22] Filed: Jul. 16, 1998

Related U.S. Application Data

[63] Continuation-in-part of application No. 08/864,133, May 28, 1997, Pat. No. 5,933,706.

[51] Int. Cl.$^7$ .................................................. C23F 1/00
[52] U.S. Cl. ........................................................ 438/93
[58] Field of Search ...................... 216/13, 74; 438/84, 438/93, 95, 98, 102, 475

[56] References Cited

U.S. PATENT DOCUMENTS

| | | | |
|---|---|---|---|
| 4,286,277 | 8/1981 | Longshore et al. | 357/30 |
| 5,137,544 | 8/1992 | Medellin | 51/308 |
| 5,157,876 | 10/1992 | Medellin et al. | 451/36 |
| 5,279,974 | 1/1994 | Walsh | 437/3 |
| 5,457,330 | 10/1995 | Turner et al. | 257/188 |
| 5,528,495 | 6/1996 | Roscoe | 364/422 |

FOREIGN PATENT DOCUMENTS

WO 9620412  12/1995  WIPO.

OTHER PUBLICATIONS

Luke, P.N., Eissler, E.E., "Performance of CdZnTe Coplanar–Grid Gamma–Ray Detectors" IEEE Trans. On Nucl. Sci., vol. 43, No. 34, Jun. 1996, p. 1481–1486.

Chen, H., Egarievwe, E.U., Hu, Z., Tong, J., Shi, D.T., Wu, G.H., Chen, K.–T., George, M. A., Collins, W.E., James, R.B., Stahle, C.M., Bartlett, L.M., "Study of Gamma–Ray detector performance of $Cd_{1-x}Zn_xTe$ crystal treated by different etchants" Proc. SPIE–Int. Soc. Opt. Eng. vol. 2859, 1996, p. 254–262.

Chen, H., Hu, Z., Tong, J., Shi, D.T., Wu, G.H., Chen, K.–T., George, M.A., Collins, W.E., Burger, A., James, R.B., Stahle, C.M., Bartlett, L.M., "Low temperature photoluminescence of detector grade $Cd_{1-x}ZnTe$ crystal treated by different etchants" J. Appl. Phys., vol. 80, No. 6, Sep. 1996, p. 3509–3512.

Burger, A., Chen, H., Tong, J., Shi, D.T., George, M.A., Chen. K.–T., Collins, W.E., James, R.B., Stahle, C.M., Bartlett, L.M., "Investigation of electrical contacts for $Cd_{1-x}Zn_xTe$ nuclear radiation detectors" IEEE Trans. On Nucl. Sci., vol. 44, No. 3, Jun. 1997, p. 934–938.

Chen, K.–T., Shi, D.T, Chen, H, Granderson, B., George, M.A., Collins, W.E., Burger, A., "Study of oxidized cadmium zinc telluride surfaces" J. Vac. Sci. Technol., A, vol. 15 No. 3, May/Jun. 1997, p. 83–86.

Mescher, M.J., Reed, M.L., Schlesinger, T.E., "Stress control in sputtered silicon nitride films" Mat. Res. Soc. Symp. Proc., vol. 472, 1997 p. 239–244.

James, R.B., Schlesinger, T.E., Siffert, P., Dusti, W., Squillante, M.R., O'Connell, M., Cuzin, M., "Semiconductors for Room–Temperature Radiation Detector Applications II" Mat. Res. Soc. Symp. Proc., vol. 487, 1998, p. 65–70.

*Primary Examiner*—Richard Bueker
*Assistant Examiner*—Alva C Powell
*Attorney, Agent, or Firm*—Timothy Evans

[57] ABSTRACT

A method for reducing the leakage current in CZT crystals, particularly $Cd_{1-x}Zn_xTe$ crystals (where x is greater than equal to zero and less than or equal to 0.5), and preferably $Cd_{0.9}Zn_{0.1}Te$ crystals, thereby enhancing the ability of these crystal to spectrally resolve radiological emissions from a wide variety of radionuclides. Two processes are disclosed. The first method provides for depositing, via reactive sputtering, a silicon nitride hard-coat overlayer which provides significant reduction in surface leakage currents. The second method enhances the passivation by oxidizing the CZT surface with an oxygen plasma prior to silicon nitride deposition without breaking the vacuum state.

25 Claims, 3 Drawing Sheets

METHOD FOR SURFACE PASSIVATION AND PROTECTION OF CADMIUM ZINC TELLURIDE CRYSTALS

CROSS-REFERENCE TO RELATED APPLICATIONS

The following application is a Continuation-in-Part application of prior U.S. patent application Ser. No. 08/864,133, originally filed May 28, 1997 now U.S. Pat. No. 5,533,706 entitled "METHOD FOR SURFACE TREATMENT OF CADMIUM ZINC TELLURIDE CRYSTALS" from which priority is claimed.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention pertains generally to methods for improving the performance of detectors for gamma-ray and x-ray spectrometers and imaging systems, and particularly to a method for treating the surface of CdZnTe detector crystals to reduce leakage currents and increase spectral resolution.

Many of the commonly used radiation detectors employ Si(Li) or Ge semiconductor materials and thus operate most effectively at cryogenic temperatures and in a very clean vacuum. The need to operate Si(Li) or Ge-based detectors under these rigorous conditions poses significant limitations on the use of these materials in those applications where portability is desired. The general requirement for room temperature operation of a semiconducting material as a nuclear detector and spectrometer is a relatively large band gap energy such that thermal generation of charge carriers is kept to a minimum. Conversely, the requirement for high resolution is a small band gap energy such that a large number of electron-hole pairs is created for an absorbed quantum of ionizing radiation. The material under consideration should also have a relatively high average atomic number if used in gamma ray spectroscopy to increase the gamma ray interaction probability. High charge carrier mobilities and long charge carrier lifetimes are also needed to ensure efficient charge carrier extraction and minimal effects from position dependent charge collection.

CdZnTe (CZT) and particularly $Cd_{1-x}Zn_xTe$ (where x is greater than or equal to zero and less than or equal to 0.5), is a wide bandgap ternary II-VI compound semiconductor that, because of its unique electronic properties, is desirable for use in gamma-ray and x-ray spectrometers that operate at room temperature for nuclear radiation detection, spectroscopy, and medical imaging applications. However, the performance of gamma-ray and x-ray spectrometers fabricated from CZT crystals is often limited by surface leakage currents. Surface leakage currents act as a source of noise that reduces the ability of these spectrometers to spectrally resolve the unique radiological emissions from a wide variety of radioactive isotopes. Thus, in order to improve the spectral resolution capability of devices based on CZT crystals it is desirable to decrease surface leakage currents and the attendant detrimental noise effects.

It is known in the art that for a semiconductor crystal to function effectively as a good detector material (i.e., minimizing surface leakage currents, thereby maximizing energy resolution) the crystal surfaces must be properly treated. Generally, this means chemical etching of the surfaces to eliminate undesirable surface features. Currently the method for surface treatment of CZT crystals is to chemically etch the crystal surfaces in a solution of bromine dissolved in methanol to provide a planar surface prior to attachment of electrical contacts. These solutions are used because they reliably produce surfaces on CZT crystals that are substantially planar and have a low surface leakage current. However, there is a need to reduce the surface leakage current in CZT crystals even further in order to improve spectral resolution. What is required is a method for surface treatment of CZT crystal that will eliminate or reduce surface leakage currents to a level that is presently unattainable using prior art methods.

SUMMARY OF THE INVENTION

CdZnTe (CZT) crystals, particularly $Cd_{1-x}Zn_xTe$ (where x is greater than or equal to zero and less than or equal 0.5) crystals, and preferably $Cd_{0.9}Zn_{0.1}Te$ crystals, are useful for fabrication of small, portable, room temperature radiation detectors. The present invention provides a method for surface treatment of CZT crystals that reduces surface leakage currents to a previously unattainable level and simultaneously provides a hard-coat over-layer which should prevent performance decay over time due to exposure to moisture and other gases in the working environment thereby providing for improved energy resolution and reliability. Two processes are disclosed. These processes follow either a traditional bromine-methanol etch treatment or an improved wet etch consisting of a solution containing HBr, ethylene glycol, and bromine in ratios of approximately 10:10:1 with a ±20% variation in these concentrations. These results have been found to be improved still further by rinsing the etch crystal in pure ethylene glycol immediately following the etch process.

The first process entails only a low-temperature sputter-deposited silicon nitride overlayer. The second process involves exposing the CZT detector sample to a surface-oxidizing oxygen plasma which is then followed by the low-temperature silicon nitride overlayer deposition.

DETAILED DESCRIPTION OF THE INVENTION

Figure 1:
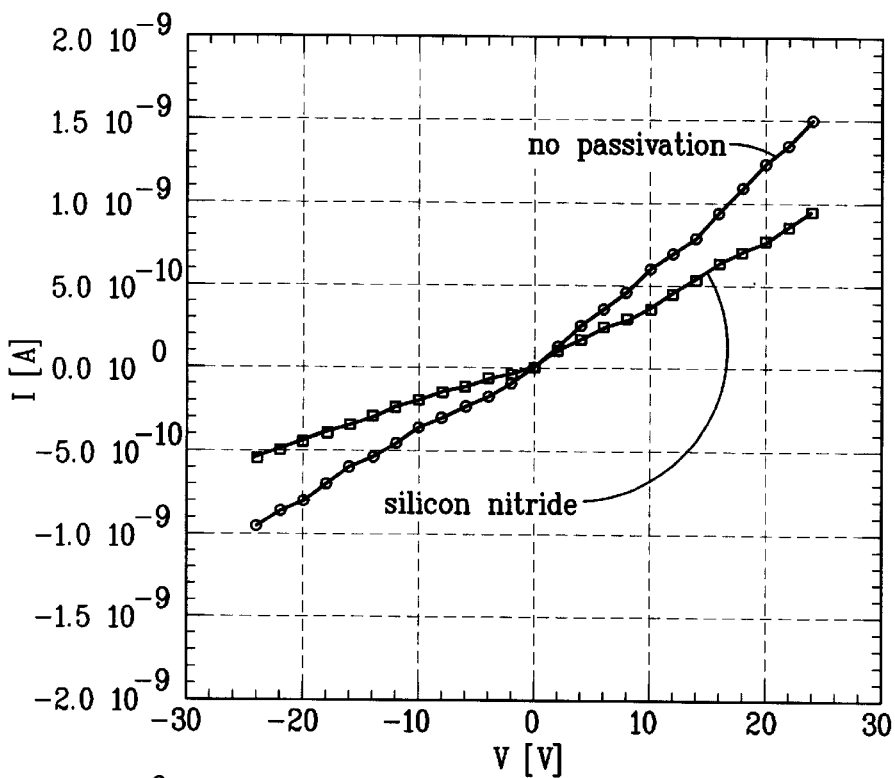
FIG. 1 shows the current/voltage curves for CZT crystals having no passivation compared to those for a silicon nitride-passivated CZT crystal.

The present invention provides a novel and nonobvious method for producing a CZT crystal having a low value of leakage current unattainable with present surface treatment methods. A used hereinafter the term "crystal" as applied to CZT shall mean both single crystals and polycrystalline examples. The novel processes disclosed herein comprise depositing a hard-coat silicon nitride layer onto the CZT crystal surface after electrode deposition and patterning.

Oxidizing the CZT surface via an oxygen plasma prior to nitride deposition and depositing a silicon nitride layer which is known to possess near optimal properties in terms of stoichiometry and dielectric properties are shown to further enhance the passivating capability of this technique.

It is believed that surface leakage currents are due in large part to the presence on the crystal surface of a thin layer of non-stoichiometric material having an electrical resistivity lower than the bulk crystal material.

Chemical etchants typically used to prepare samples for electrode deposition do not act uniformly on all the components of materials such as CZT, generally leaving behind regions of nonstoichiometric material. In the case of a CZT crystal etched in a bromine/methanol solution, this nonstoichiometric material is believed to be a tellurium-rich surface layer having a conductivity that is substantially greater than the underlying stoichiometric CZT material. Since leakage current is proportional to electrical conductivity, it is desirable to generate a reaction at the surface which will form high-resistance compounds (oxides or nitrides) from the metallic constituents at the surface, thereby reducing the conductivity of the crystal surface layer.

The present invention solves this problem by novel processes which expose the CZT surface to high-energy nitrogen and/or oxygen radicals and ions. The first embodiment exposes the CZT surface to high-energy nitrogen radicals which are believed to react at the CZT surface to form high-resistivity metallic compounds. Simultaneously, a thin hard-coat overlayer (nominally 1000 Å) of reactively-sputtered silicon nitride is being laid down onto the CZT surface. It is postulated that this overlayer prevents conduction induced by moisture or other gases in the operating environment. The conditions used for this process are shown below in Table 1.

TABLE 1

Deposition conditions for sputtered silicon nitride on CZT.

| Pressure | $N_2$ flow | Ar flow | RF Power | Target bias |
|---|---|---|---|---|
| 5.5 mTorr | 6 sccm | 21 sccm | 100 Watts | −300 Volts |

These parameters were chosen to mimic those found in the prior art to be optimal in terms of stoichiometry, refractive index, and residual stress. However, the properties of reactively sputtered films are significantly dependent on the characteristics of a particular sputtering system. Because the instant invention utilizes a system different from the prior art system in which the silicon nitride films were optimized, it is not clear to what extent the electrical properties of these particular silicon nitride films were similarly optimized. It is thus highly probable that improved passivation with silicon nitride alone can be achieved with optimization of the silicon nitride deposition process.

Figure 3:
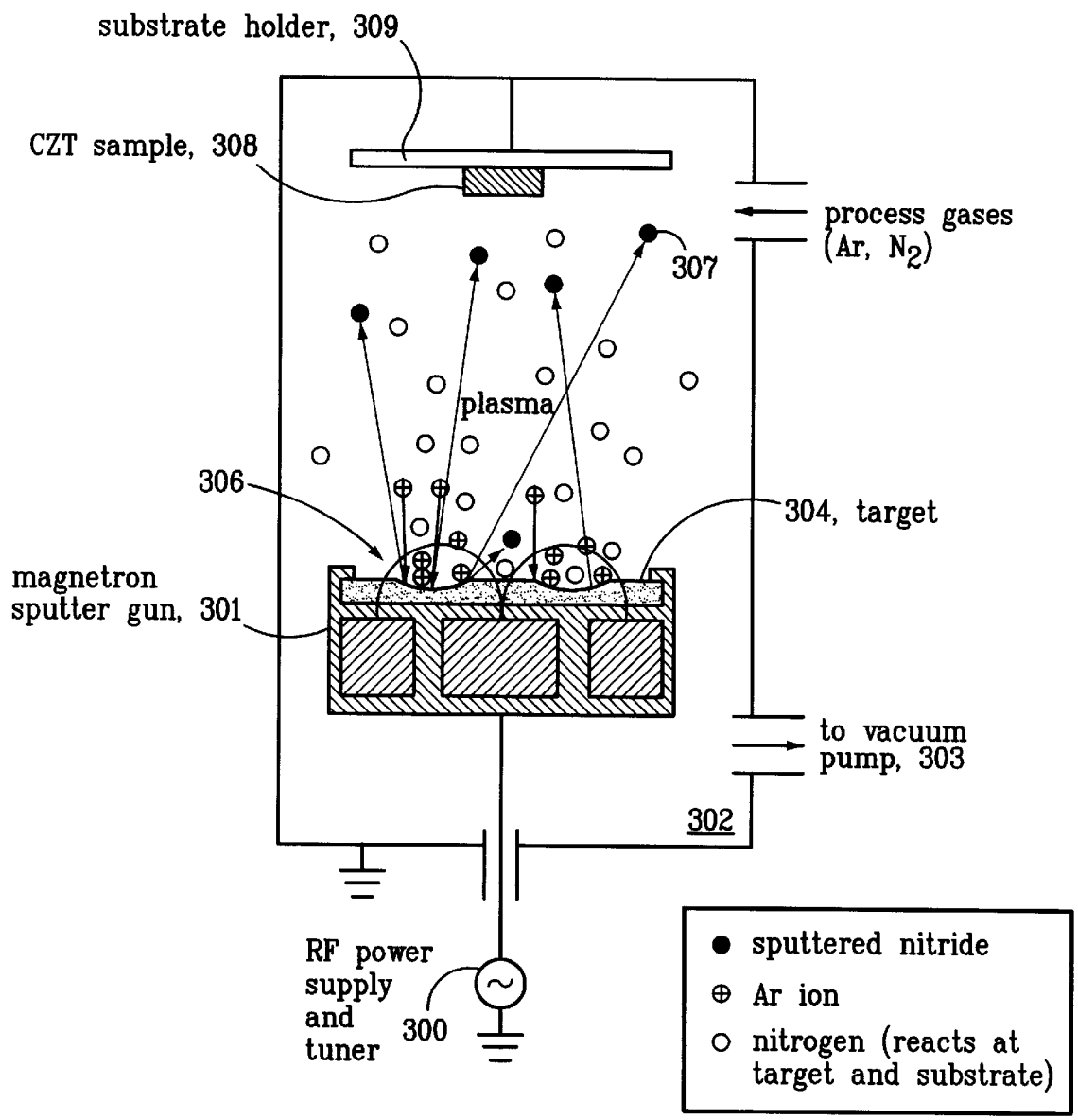
FIG. 3 illustrates a simplified view of a magnetron sputtering system.

The sputter process itself is conventional. A diagrammatic sketch of the process is shown in FIG. 3. Radio frequency (RF) power supply 300 is attached to a standard magnetron sputter gun 301 which is itself held within a high vacuum chamber 302 connected to a high speed, cryo-pump vacuum pump 303. A target element 304 is held in the sputter gun in electrical contact with the RF source 300. Argon and Nitrogen process gas is admitted into chamber 302 at which point the argon atoms 305 are ionized by the RF field (not shown) and accelerated toward target 304. The high energy magnet in gun 301 retains the argon ion 305 in a looping circulation pattern 306 which brings them repeated into contact with target 304. As these high energy ions strike the surface of target 304, material is dislodged and ejected by a momentum transfer process. As the target surface is "cleaned" by the action of the argon plasma the added nitrogen gas reactions with this surface to form a nitride layer. It is this layer which eroded by the plasma, dislodged as nitride fragments 307 and ejected with enough energy to travel to the surface of the CZT crystal 308, attached to substrate holder 309, which is to be passivated.

The current/voltage relationships shown in FIG. 1 compare the leakage current before and after the silicon nitride passivation. An average of the slopes taken over the coordinate intervals [−25, −5] and [5,25] (necessary to avoid the non-linearity at low applied voltage) yields an improvement in measured resistance of a factor of approximately 1.7.

In a second embodiment, the etch CZT surface is first exposed to a high-energy oxygen plasma. Oxygen ions are accelerated towards the CZT sample under the influence of an electrical potential and attain energies which are nominally equivalent to the CZT sample bias voltage, in electron volts. This voltage can be externally varied to control, to some extent, the penetration and thus the reaction depth of the oxygen.

Figure 4:
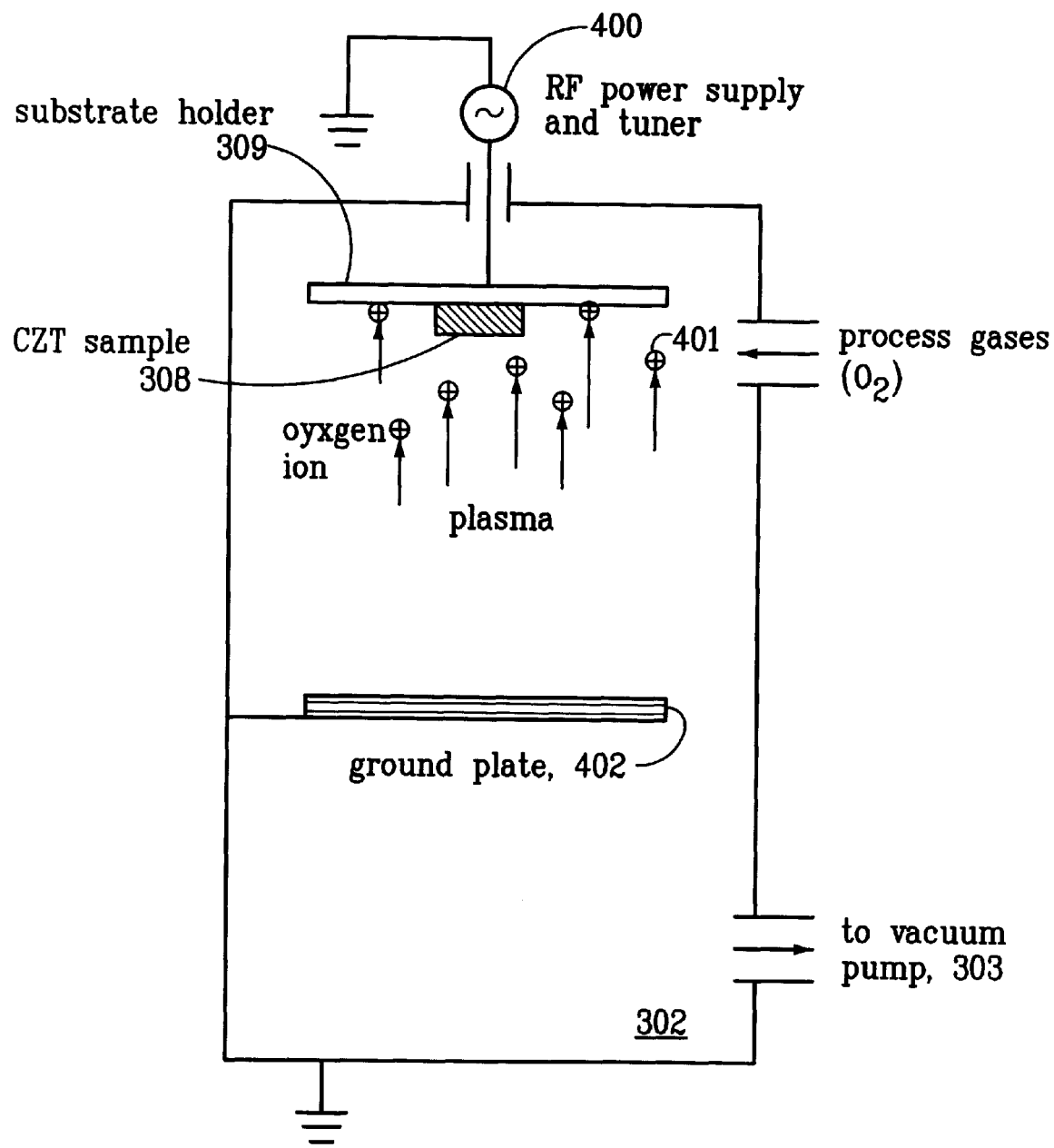
FIG. 4 illustrates a simplified view of an RF-induced oxygen plasma system.

The oxygen plasma process is again conventional and is illustrated in FIG. 4. Processing is conducted inside the same vacuum chamber 302 in which nitride sputter is performed. In this case, however, radio frequency (RF) power supply 400 is attached to substrate holder 309 which holds CZT crystal 308. A high voltage negative potential (nominally between about −300V to −500V) is established on the CZT substrate holder in order to provide a sufficient gradient with which to accelerate ions onto the crystal. High speed, cryo-pump vacuum pump 303 maintains requisite overall system pressure of 5 mTorr to 20 mTorr as oxygen is admitted into chamber 302. As oxygen enters chamber 302 it is ionized in the intense RF field (not shown) and ions 401 are accelerated under the influence of the electrical potential applied to the CZT crystal. Ground plate 402 is included to provide a grounded electrode for the RF Field and located in relation to substrate holder 309 to achieve and sustain the plasma. The oxidation process is performed for a period of about 5 minutes.

An oxidized surface on the CZT sample is thus formed. The conditions for this oxygen plasma process are shown below in Table 2.

TABLE 2

Plasma oxidation conditions.

| Pressure | $O_2$ Flow | RF Power | Subst. bias | time |
|---|---|---|---|---|
| 16 mTorr | 95 sccm | 30 Watts | −330 Volts | 5 min |

A hard-coat silicon nitride layer is then deposited onto the passivated and oxidized surface of the CZT crystal without breaking the reaction chamber vacuum. This process is novel not only in that silicon nitride is used as a passivating layer but also with regards to its ability to encapsulate an oxidized CZT surface without an intermediate exposure to a wet etchant, to moisture, or to other gases in the working environment.

Figure 2:
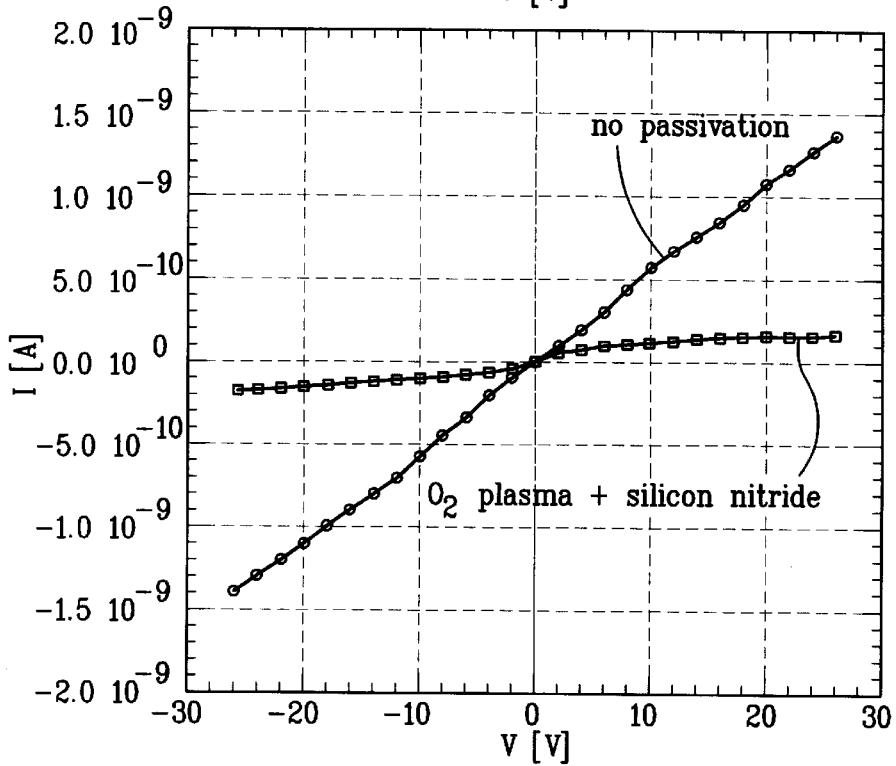
FIG. 2 shows the current/voltage curves for CZT crystals having no passivation compared to those for a CZT crystal passivated with a single-pumpdown process consisting of a surface-oxidizing oxygen plasma and silicon nitride deposition.

The current/voltage relationship shown in FIG. 2 compare the leakage current before and after the combination of oxygen plasma exposure and silicon nitride passivation. The current-voltage measurements shown in FIG. 1 and FIG. 2 were made at room temperature using, by way of example, a Keithley Model 237 programmable source-measurement unit. The same measurement technique as used for FIG. 1 yields a significantly enhanced improvement in measured resistance of a factor of approximately 20.

Co-pending patent application Ser. No. 08/864,133, herein incorporated by reference in its entirety, has previously been demonstrated that surface treatments which decrease surface leakage current enhance CZT detector performance. It is clear given that the described processes in no way adversely affect the bulk CZT material that these passivation methods will also provide enhanced detector performance, especially the combined oxygen plasma/silicon nitride overlayer process.

Other dielectric nitride films known to those skilled in the art of reactive sputtering processes can provide surface passivation for CZT crystals. Potential candidates, beyond that of silicon nitride, include boron nitride, germanium nitride, aluminum nitride and gallium nitride. Significant variation in the parameters used for both the silicon nitride deposition and oxygen plasma steps may also yield processes which provide significant passivating capability.

In summary, the present invention provides a novel method for reducing the leakage current of CZT crystals, particularly $Cd_{1-x}Zn_xTe$ (where x is greater than or equal to zero and less than or equal 0.5), and preferably $Cd_{0.9}Zn_{0.1}Te$ crystals, thereby enhancing their ability to spectrally resolve radiological emissions from a wide variety of radionuclides. The present method provides for depositing, via reactive sputtering, a silicon nitride hard-coat overlayer which provides significant reduction in surface leakage currents and protects from moisture and gases in the operating environment. This property is further enhanced by oxidizing the CZT surface with an oxygen plasma prior to silicon nitride deposition without breaking the vacuum state.

From the foregoing description, one skilled in the art can readily ascertain the essential characteristics of the present invention. The description is intended to be illustrative of the present invention and is not to be construed as a limitation or restriction thereon, the invention being delineated in the following claims.

We claim:

1. A method for reducing leakage current and improving spectral resolution in CdZnTe crystals, comprising the steps of:
    a) etching a surface of a CdZnTe crystal;
    b) placing said crystal into a partial vacuum;
    c) applying conductive electrodes onto said etched surface of said crystal; and
    d) applying a reactively-sputtered, hard-coat, nitride layer over said electrodes and said surface.

2. A method for reducing leakage current and improving spectral resolution in CdZnTe crystals, comprising the steps of:
    a) etching a surface of a CdZnTe crystal;
    b) placing said crystal into a partial vacuum;
    c) applying conductive electrodes onto the etched surface of said crystal;
    d) oxidizing said surface with an oxygen plasma; and
    e) applying a reactively sputtered, hard-coat, nitride layer over said electrodes and said oxidized surface.

3. The method of claim 1, wherein the CdZnTe crystal has a stoichiometric formulation essentially of $Cd_{1-x}Zn_xTe$ and x has a value between zero and 0.5.

4. The method of claim 1, wherein the step of etching further comprises a solution containing 5% bromine in methanol.

5. The method of claim 1, wherein step of etching further comprises a solution containing HBr acid, ethylene glycol and bromine, and further includes a subsequent rinse in ethylene glycol.

6. The method of claim 5, wherein the solution consists essentially of a mixture of HBr acid, ethylene glycol and bromine wherein said constituents are present in a ratio of approximately 10:10:1 respectively.

7. The method of claim 1, wherein the conducting electrodes are patterned for planar or non-planar CdZnTe devices.

8. The method of claim 1, wherein the conducting electrodes are composed of gold or platinum.

9. The method of claim 1, wherein the nitride layer is deposited using a reactive sputtering apparatus, said apparatus for accelerating argon atoms onto a target surface, said apparatus containing a low pressure quantity of nitrogen gas, said nitrogen gas reacting with said target surface to form a nitride compound, said accelerated argon atoms dislodging molecules and clusters of molecules of said nitride compound from said target surface by a process of momentum transfer, said nitride molecules and cluster of molecules moving toward and depositing onto said CdZnTe crystal surface.

10. The method of claim 1 wherein, in the first and second steps of applying are performed without breaking said vacuum and exposing said CdZnTe crystal to external ambient atmosphere.

11. The method of claim 1, wherein the passivating nitride layer is boron nitride, silicon nitride, germanium nitride, aluminum nitride or gallium nitride.

12. The method of claim 2 wherein the CdZnTe crystal has a stoichiometric formulation essentially of $Cd_{1-x}Zn_xTe$ and x has a value between zero and 0.5.

13. The method of claim 2, wherein the step of etching further comprises a solution containing 5% bromine in methanol.

14. The method of claim 2, wherein step of etching further comprises a solution containing HBr acid, ethylene glycol and bromine, and further includes a subsequent rinse in ethylene glycol.

15. The method of claim 14, wherein the solution consists essentially of a mixture of HBr acid, ethylene glycol, and bromine wherein said constituents are present in a ratio of approximately 10:10:1 respectively.

16. The method of claim 2, wherein the conducting electrodes are patterned for planar of non-planar CdZnTe devices.

17. The method of claim 2, wherein the conducting electrodes are composed of gold or platinum.

18. The method of claim 2, wherein the step of oxidizing further comprises the steps of:
    a) introducing a partial pressure of oxygen into said partial vacuum, said partial pressure of oxygen between about 5 mTorr and 20 mTorr;
    b) applying a negative electrical bias voltage to said CdZnTe crystal, said voltage about between 0 and −500 Volts;
    c) forming an oxygen plasma by applying a radio frequency signal in said partial pressure of oxygen, said signal having a power level about 100 Watts.
    d) maintaining said plasma for a time period of about 5 minutes while maintaining said partial pressure of oxygen.

19. The method of claim 2, wherein said nitride layer is deposited using a reactive sputtering apparatus, said apparatus for accelerating argon atoms onto a target surface, and apparatus containing a low partial of nitrogen gas, and nitrogen gas reacting with said target surface to form a nitride compound, said accelerated argon atoms dislodging molecules and clusters of molecules of said nitride compound from said target surface by a process of momentum transfer, said nitride molecules and cluster of molecules moving toward and depositing onto said CdZnTe crystal surface.

20. The method of claim 2, wherein in the first and second steps of applying and the step of oxidizing are performed without intermediate exposure to an external ambient atmosphere.

21. The method of claim 2, wherein the passivating nitride layer is boron nitride, silicon nitride, germanium nitride, aluminum nitride, or gallium nitride.

22. The radiation detector or sensor comprising a CdZnTe crystal or plurality of crystals, modified by the process of claim 1.

23. A radiation detector or sensor comprising a CdZnTe crystal or plurality of crystals, modified by the process of claim 2.

24. A radiation detector as in claim 22 wherein the CdZnTe crystal has a stoichiometric formulation of $Cd_{1-x}Zn_xTe$ and x has a value between zero and 0.5.

25. A radiation detector as in claim 23 wherein the CdZnTe crystal has a stoichiometric formulation of $Cd_{1-x}Zn_xTe$ and x has a value between zero and 0.5.

* * * * *